United States Patent [19]

Terhune

[11] Patent Number: 4,581,813
[45] Date of Patent: Apr. 15, 1986

[54] METHOD FOR PRODUCING ENCAPSULATED THERMOCOUPLES

[75] Inventor: James H. Terhune, San Jose, Calif.

[73] Assignee: General Electric Company, San Jose, Calif.

[21] Appl. No.: 661,799

[22] Filed: Oct. 17, 1984

[51] Int. Cl.⁴ .......................................... H01L 35/34
[52] U.S. Cl. ..................................... 29/573; 250/392; 264/0.5; 376/154; 376/247; 376/254
[58] Field of Search ............... 29/573; 250/390, 391, 250/392; 264/0.5, 60, 61; 376/154, 247, 254

[56] References Cited

U.S. PATENT DOCUMENTS

| | | | |
|---|---|---|---|
| 2,383,353 | 8/1945 | Steele | 432/156 |
| 2,673,228 | 3/1954 | Kistler | 373/152 |
| 3,564,246 | 2/1971 | Morrison | 250/392 |
| 3,939,554 | 2/1976 | Finney | 29/573 |
| 4,277,886 | 7/1981 | Bauer et al. | 29/573 X |
| 4,406,011 | 9/1983 | Burns | 376/247 |

Primary Examiner—Brian E. Hearn
Assistant Examiner—Alan E. Schiavelli
Attorney, Agent, or Firm—Ivor J. James, Jr.; Samuel E. Turner; Raymond G. Simkins

[57] ABSTRACT

A method for fabricating a thermocouple unit for service in and about nuclear reactors and other radioactive environments. The method provides a thermocouple encapsulated within a sphere of fissile material.

10 Claims, 2 Drawing Figures

METHOD FOR PRODUCING ENCAPSULATED THERMOCOUPLES

BACKGROUND OF THE INVENTION

Thermocouple devices have been used in a variety of diverse applications including nuclear service, for example U.S. Pat. No. 4,406,011, and accordingly have been developed in an assortment of designs shown in the art such as in U.S. Pat. Nos. 3,939,554 and 4,277,886.

SUMMARY OF THE INVENTION

This invention is directed to a specific thermocouple construction comprising the metal junction encapsulated within a fissile material, and it consists of a unique and improved means for producing such thermocouple units.

The invention is specifically concerned with the fabrication of thermocouples of the type disclosed in my copending application for patent, entitled FISSION-COUPLE NEUTRON SENSOR, Serial No. 560,122, filed Dec. 12, 1983. The disclosure of said application SN 560,122 is accordingly incorporated herein by reference.

The method of this invention for fabricating such fission-couple sensor elements, encloses the thermocouple wire junction concentrically within a sphere of fissile material with a high degree of control and reproduction providing consistency and accuracy in the product.

OBJECTS OF THE INVENTION

It is a primary object of this invention to provide an improved and effective method for producing thermocouples encapsulated within a sphere of metal.

It is also an object of this invention to provide a method for producing metal sphere encapsulated thermocouples which enables effective controlling of the encapsulating composition, its density and uniformity, its dimensions and sphericity, and the concentricity and symmetry of the components thereof.

It is another object of this invention to provide a method for producing thermocouple units having the wire junction encapsulated within a sphere of fissile material which is free of voids, uniform in density and concentrically surrounds the junction.

It is an additional object of this invention to provide a method for producing thermocouple units having the wire junction encapsulated within a body of fissile material of spherical configuration of near uniform radius and concentricity about the encased junction.

DETAILED DESCRIPTION OF THE PREFERRED EMBODIMENT

This invention comprises a unique method for producing improved thermocouple units wherein the wire junction is encapsulated within a sphere of fissile material and which are useful in nuclear reactors and the like service comprising radioactive environments. A typical construction for such thermocouple units is described hereinafter.

Figure 1:
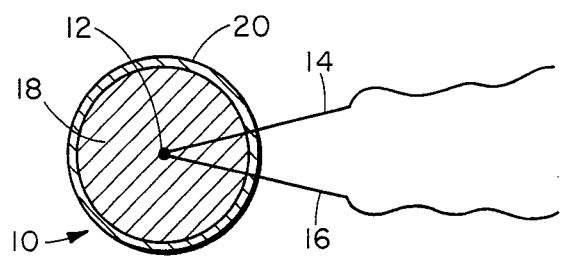
FIG. 1 is a schematic cross-sectional view of an example structure of an encapsulated thermocouple unit produced by the method of this invention.

Referring to FIG. 1 of the drawing, the thermocouple effect is created at junction 12 by the joining together in known ways of a first wire 14 and a second wire 16, typically consisting of thermocouple alloys such as the commonly used chromel and alumel to provide a preferred embodiment. Both wires are of a very small diameter, on the order of from one to two mil inches.

Thermocouple junction 12 is encapsulated in the nominal center of a sphere 18 of a fissile material such as uranium metal, and provided with a sheathing layer 20 of a noble metal such as by metal plating.

The overall sphere comprising unit 10 is typically in the range of from 35 to 40 mil inches diameter, and comprises a fissile material such as uranium, thorium or plutonium, which generates heat upon absorption of neutrons. As the fissile material of sphere 18 is heated by the action of neutrons, the thermocouple junction 12 operates in the conventional manner to develop a voltage across the output wires 14 and 16, which has a functional dependence on the temperature at the thermocouple junction.

Sheathing layer 20 encasing sphere 18 is preferably comprised of a thin layer of gold less than a mil inch thick. The thin sheathing layer 20 is selected from a group of noble metals capable of providing a thermal bond, such as gold, platinum and palladium. Sheathing layer thickness generally range from 0.1 to 0.3 mil inches, and preferably about 0.2 mil inches, and typically is applied by conventional metal plating procedures such as electrolytic deposition.

Figure 2:
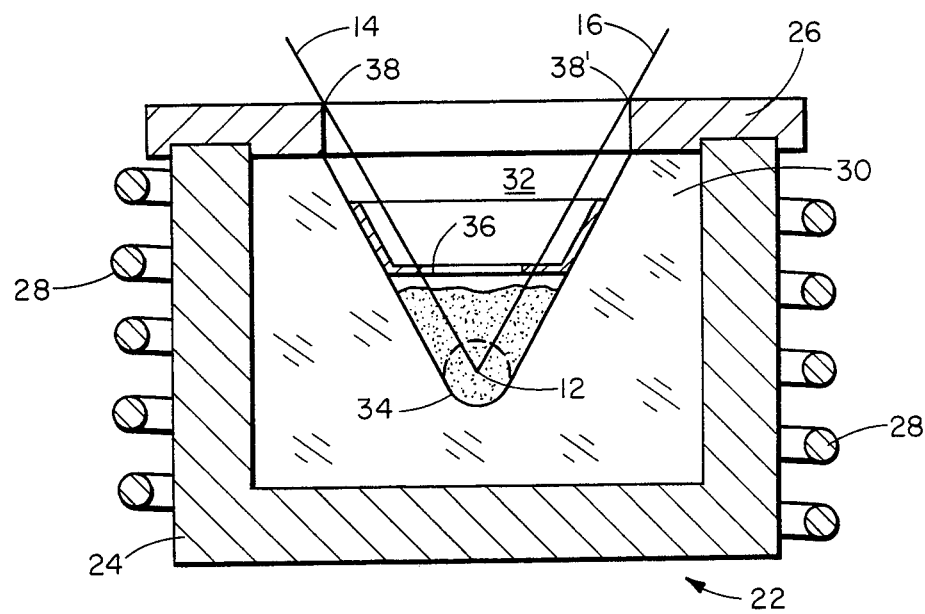
FIG. 2 is a schematic cross-sectional view of a crucible assemblage and system preferably employed in carrying out the method of this invention.

Appropriate means for carrying out a preferred procedure of the method of this invention is the apparatus shown in FIG. 2, which comprises a crucible assembly 22.

Crucible assembly 22 includes metal cup 24, and cap 26, surrounded by radio-frequency coils 28 for heating the metal cup and in turn the crucible and its contents. Cup 24 and cap 26 are composed of a refractory metal such as molybdenum.

Contained within metal cup 24 is a ceramic crucible 30 formed from a high grade, fine grained refractory ceramic such as alumina or magnesia. Ceramic crucible 30 is provided with an internal cavity 32 of an aptly dimensioned conical configuration having a hemispherical apex 34 of a precisely predetermined spherical radius forming the base or terminal of its downwardly converging cavity 32.

Preferably an annular bracket 36 is provided within the conical cavity 32 of crucible 30 to position and support thermocouple wires, such as leads 14 and 16, in a predetermined arrangement whereby their adjoining ends forming the thermocouple junction 12 is concentrically located within the hemispherical apex 34 of the conical cavity 32. Also, the metal cap 26 for cup 24 provides an apt structure for temporarily securing lead wires in fixed position such as by tack welds 38-38' or other attachment.

In a preferred embodiment of the method of this invention, the wire leads 14 and 16, such as a fine chromel wire and a fine alumel wire, which are joined together at an end thereof to provide a typical thermocouple junction 12, are aptly positioned extending down into the internal cavity 32 of ceramic crucible 30, and therein affixed as described. Wires 14 and 16 are arranged and positioned symmetrically with their adjoined ends forming the thermocouple junction 12 concentrically located within the hemispherical apex 34 of the internal conical cavity 32 of crucible 30. That is, the junction 12 is located at approximately an equal distance from all portions of the surface of the hemisphere of apex 34.

With the thermocouple junction 12 thus centered, the lead wires 14 and 16 extending therefrom are suitably secured to retain the precise positioning of the junction 12 throughout the remaining fabrication procedure. For instance, in a preferred embodiment the wires 14 and 16 are symmetrically extended upwardly and outwardly from the conically shaped cavity 32 generally parallel to the wall thereof as shown in FIG. 2. Thus arranged and positioned, the wires 14 and 16 can be secured to metal cap 26 by tack welds 38-38', or to bracket 36 by appropriate means, and preferably are affixed to both cap 26 and bracket 36.

Upon positioning and securing the thermocouple junction 12 and associated lead wires 14 and 16, a measured amount of an oxide of a fissile metal such as uranium oxide in fine powdered form is deposited in the hemispherical apex 34 of the crucible cavity 32 surrounding the thermocouple junction 12 affixed therein concentrically with the hemispherical apex 34. The amount of powdered oxide metal is predetermined to produce a metal sphere upon reduction of the oxide, in a designed diameter and which essentially corresponds to the designed diameter of the hemispherical apex 34.

The crucible assembly 22 and its powdered oxide contents are heated with the radio-frequency coil 28 to a predetermined temperature whereby the metal oxide is reduced and the metal melted while surrounding the thermocouple junction 12. Surface tension of the resulting molten metal within the hemispherical apex 34 contracts the melt into an essentially precise sphere of substantially uniform mass concentrically enclosing the thermocouple junction 12. Of course, the respective composition of the crucible 30 and fissile metal melted therein must be selected whereby the melt does not wet the crucible material so that a spherical curvature and configuration for the molten metal can be achieved and maintained through surface tension.

Following reduction and melting, the crucible 30 and its spherical melt are gradually cooled to solidify the metal as a sphere free of voids and of uniform density concentrically surrounding the thermocouple junction 12 therein. Upon solidification and cooling close to ambient temperature conditions, the lead wires 14 and 16 can be separated from any securing means, and the composite thermocouple unit comprising the junction 12 encapsulated within the nominal center of a sphere 18 of fissile material removed from the crucible unit 22.

A protective sheathing of a thin layer 20 of a noble metal, for example gold, is then applied surrounding the sphere of fissile material 18 by any appropriate technique such as conventional metal plating procedures.

What is claimed is:
1. A method of producing a thermocouple, comprising the steps of:
(a) providing a refractory crucible having a conical internal cavity with a hemispherical apex in the base thereof;
(b) positioning a pair of thermocouple wires within the crucible cavity with their ends adjoining to form a junction adjacent to the hemispherical apex;
(c) depositing a quantity of powdered metal oxide in the hemispherical apex of the crucible cavity about the adjoining ends of the positioned wires;
(d) heating the crucible and its contents and thereby reducing and melting the powdered metal oxide whereby surface tension contracts the resulting molten metal into a sphere about the adjoining ends of the thermocouple wires; and
(e) cooling the crucible and the molten metal sphere within the hemispherical apex of the crucible cavity to thereby solidify a metal sphere surrounding the adjoining ends of the thermocouple wires.

2. The method of claim 1, wherein the powdered metal oxide is a fissile material.

3. The method of claim 1, wherein the powdered metal oxide is uranium oxide.

4. The method of claim 1, wherein the solidified metal sphere surrounding the adjoining ends of the thermocouple wires is plated with a noble metal.

5. A method of producing a thermocouple, comprising the steps of:
(a) providing a refractory crucible having a conical internal cavity with a hemispherical apex in the base thereof;
(b) positioning a pair of thermocouple wires within the crucible cavity with their ends adjoining to form a junction centered within the hemispherical apex;
(c) depositing a predetermined quantity of a powdered oxide of a fissile metal in the hemispherical apex of the crucible cavity about the adjoining ends of the positioned wires;
(d) heating the crucible and its contents and thereby reducing and melting the powdered oxide metal whereby surface tension contracts the resulting molten metal into a sphere about the adjoining ends of the thermocouple wires centered therein; and
(e) cooling the crucible and molten metal sphere within the hemispherical apex of the crucible cavity to thereby solidify a fissible metal sphere surrounding the adjoining ends of the thermocouple wires centered therein.

6. The method of claim 5, wherein the powdered oxide of a fissile metal is uranium oxide.

7. The method of claim 5, wherein the solidified fissile metal sphere surrounding the adjoining ends of the thermocouple wires is plated with a noble metal.

8. The method of claim 5, wherein the solidified fissile metal sphere surrounding the adjoining ends of the thermocouple wires is plated with gold.

9. The method of claim 5, wherein the adjoining ends of the thermocouple wires forming the junction are concentrically positioned within the hemispherical apex and in turn in the solidified metal sphere, and symmetrically positioned extending outward therefrom.

10. A method of producing a thermocouple, comprising the steps of:
(a) providing a refractory crucible having a conical internal cavity with a hemispherical apex of predetermined dimensions in the base thereof;
(b) positioning a pair of thermocouple wire extending into the crucible cavity in symmetrical relationship with their ends adjoining to form a junction concentrically located within the hemispherical apex;
(c) depositing a predetermined quantity of powdered uranium oxide in the hemispherical apex of the crucible cavity about the ends of the positioned thermocouple wires forming the junction;

(d) heating the crucible and its contents and thereby reducing and melting the powdered uranium oxide whereby surface tension contracts the resulting molten metal rnto a sphere about the adjoining ends of the thermocouple wires forming the junction concentrically located within the hemispherical apex;

(e) cooling the crucible and molten metal sphere within the hemispherical apex of the crucible cavity to thereby solidify the uranium metal sphere concentrically surrounding the adjoining ends of the thermocouple wires forming the junction; and (f) plating the solidified uranium metal sphere with gold.

* * * * *